(12) United States Patent
Huang et al.

(10) Patent No.: US 9,425,176 B2
(45) Date of Patent: Aug. 23, 2016

(54) CASCODE TRANSISTOR DEVICE AND MANUFACTURING METHOD THEREOF

(71) Applicant: National Taiwan University, Taipei (TW)

(72) Inventors: Jian-Jang Huang, Taipei (TW); Liang-Yu Su, Taipei (TW); Chih-Hao Wang, Taipei (TW)

(73) Assignee: NATIONAL TAIWAN UNIVERSITY, Taipei (TW)

( * ) Notice: Subject to any disclaimer, the term of this patent is extended or adjusted under 35 U.S.C. 154(b) by 0 days.

(21) Appl. No.: 14/587,916

(22) Filed: Dec. 31, 2014

(65) Prior Publication Data

US 2016/0190114 A1 Jun. 30, 2016

(51) Int. Cl.
| | |
|---|---|
| *H01L 25/18* | (2006.01) |
| *H01L 23/498* | (2006.01) |
| *H01L 25/07* | (2006.01) |
| *H01L 23/00* | (2006.01) |
| *H01L 21/48* | (2006.01) |
| *H01L 25/00* | (2006.01) |

(52) U.S. Cl.
CPC ............ *H01L 25/18* (2013.01); *H01L 21/4846* (2013.01); *H01L 23/49844* (2013.01); *H01L 24/49* (2013.01); *H01L 24/85* (2013.01); *H01L 25/072* (2013.01); *H01L 25/50* (2013.01); *H01L 2224/48153* (2013.01); *H01L 2924/1033* (2013.01); *H01L 2924/10253* (2013.01); *H01L 2924/13064* (2013.01); *H01L 2924/13091* (2013.01)

(58) Field of Classification Search
None
See application file for complete search history.

(56) References Cited

U.S. PATENT DOCUMENTS

| | | | |
|---|---|---|---|
| 9,171,837 B2 * | 10/2015 | Rutter | ............... H01L 23/49531 |
| 2010/0117095 A1 * | 5/2010 | Zhang | ................. H01L 27/0605 257/76 |
| 2014/0225162 A1 | 8/2014 | Briere | |

* cited by examiner

*Primary Examiner* — Andres Munoz
(74) *Attorney, Agent, or Firm* — Muncy, Geissler, Olds & Lowe, P.C.

(57) ABSTRACT

A semiconductor device comprises a substrate, a patterned conductive layer, a first transistor structure and a second transistor structure. The patterned conductive layer is formed on the substrate. The first transistor structure includes a first source, a first gate and a first drain and is electrically connected to the patterned conductive layer by flip-chip bonding. The second transistor structure includes a second source, a second gate and a second drain and is electrically connected to the patterned conductive layer by flip-chip bonding. The first gate is electrically connected to the second source through the patterned conductive layer, and the first source is electrically connected to the second drain through the patterned conductive layer.

7 Claims, 6 Drawing Sheets

CASCODE TRANSISTOR DEVICE AND MANUFACTURING METHOD THEREOF

BACKGROUND OF THE INVENTION

1. Field of Invention

The invention relates to a semiconductor device and a manufacturing method thereof and, in particular, to a semiconductor device and a manufacturing method thereof carried out by flip-chip bonding.

2. Related Art

Figure 1:
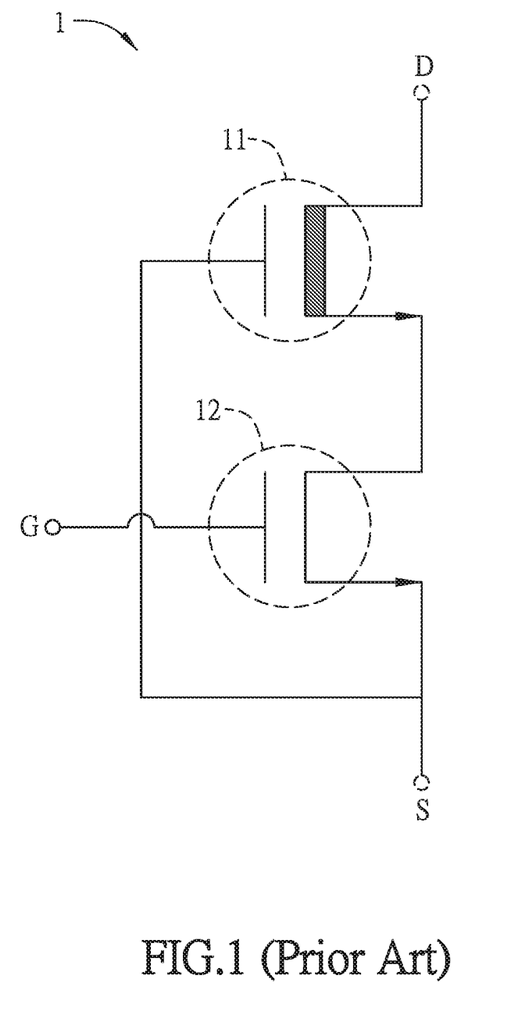
FIG. 1 is a schematic circuit diagram of a cascode transistor.

In comparison with the conventional Si metal oxide semiconductor field effect transistor (Si MOSFET), GaN high electron mobility transistor (GaN HEMT) has a wider band gap, higher breakdown voltage and higher carrier mobility. Because having the above-mentioned features, the GaN HEMT can have a lower turn-on resistance under a faster switching rate. However, the GaN HEMT innately belongs to a depletion mode device, so a cascode transistor structure is proposed for the cooperation between the GaN HEMT and other enhancement mode electrode devices. FIG. 1 is a schematic circuit diagram of a cascode transistor 1. As shown in FIG. 1, the cascode transistor 1 is formed by the connection of a GaN HEMT 11 and a field effect transistor 12 (which can be a Si MOSFET for example). Besides, the GaN HEMT 11 and the field effect transistor are mostly connected together by wire bonding in the current technology. By making the field effect transistor 12 disposed at the gate of the cascode transistor 1, the cascode transistor 1 can become an enhancement mode electronic device also with the advantages that the GaN HEMT 11 has. The cascode transistor 1, like a normal field effect transistor, includes the source S, the gate G and the drain G.

However, when the GaN HEMT 11 and the field effect transistor 12 are connected by wire bonding, some problems will occur as follows. First, the additional connection wire will cause the additional parasitic inductance, and the additional parasitic inductance will limit the frequency response of the device so as to worsen the device characteristic. Second, if the cascode transistor 1 is formed by wire bonding, the field effect transistor 12 needs to be carried out by a planar structure, which costs more than a vertical structure. Third, in order to avoid the overlap between the drain of the GaN HEMT 11 and other electrodes, the thickness of the passivation layer of the GaN HEMT 11 needs to be increased, and therefore the manufacturing cost of the device is increased.

SUMMARY OF THE INVENTION

In view of the foregoing subject, a semiconductor device and a manufacturing method thereof are provided by this invention to avoid the additional parasitic inductance that would be generated due to the overmuch connection wire between the first transistor structure and the second transistor structure and also reduce the cost.

A semiconductor device according to this invention comprises a substrate, a patterned conductive layer, a first transistor structure and a second transistor structure. The patterned conductive layer is formed on the substrate. The first transistor structure includes a first source, a first gate and a first drain and is electrically connected to the patterned conductive layer by flip-chip bonding. The second transistor structure includes a second source, a second gate and a second drain and is electrically connected to the patterned conductive layer by flip-chip bonding. The first gate is electrically connected to the second source through the patterned conductive layer, and the first source is electrically connected to the second drain through the patterned conductive layer.

In one embodiment, the patterned conductive layer further includes a first conductive region, and the first gate and the second source are both electrically connected to the first conductive region.

In one embodiment, the patterned conductive layer further includes a second conductive region, and the first source and the second drain are both electrically connected to the second conductive region.

In one embodiment, the semiconductor device further comprises at least a connection wire, one end of which is electrically connected to the second drain and the other end of which is electrically connected to the second conductive region.

In one embodiment, the patterned conductive layer further includes a third conductive region and the second gate is electrically connected to the third conductive region.

In one embodiment, the patterned conductive layer further includes a fourth conductive region and the first drain is electrically connected to the fourth conductive region.

In one embodiment, the first transistor structure is a GaN high electron mobility transistor and the second transistor structure is a Si metal oxide semiconductor field effect transistor.

A manufacturing method of a semiconductor device according to this invention at least comprises the steps of: providing a substrate; forming a patterned conductive layer on the substrate; electrically connecting a first transistor structure to the patterned conductive layer by flip-chip bonding; and electrically connecting a second transistor structure to the patterned conductive layer by flip-chip bonding. The first transistor structure includes a first source, a first gate and a first drain. The second transistor structure includes a second source, a second gate and a second drain. The first gate is electrically connected to the second source through the patterned conductive layer, and the first source is electrically connected to the second drain through the patterned conductive layer.

In one embodiment, the patterned conductive layer further includes a plurality of conductive regions, and the manufacturing method of a semiconductor device further comprises the following step of: disposing at least a connection wire. One end of the connection wire is electrically connected to the second drain, the other end thereof is electrically connected to one of the conductive regions, and the first source is electrically connected to the conductive region.

In one embodiment, the first transistor structure is a GaN high electron mobility transistor and the second transistor structure is a Si metal oxide semiconductor field effect transistor.

As mentioned above, in the semiconductor device and the manufacturing method thereof of the invention, the first transistor structure and the second transistor structure are disposed on the substrate having the patterned conductive layer by flip-chip bonding to form the cascode transistor device. Therefore, the additional parasitic inductance between the first and second transistor structures that would be caused due to overmuch connection wire can be avoided, and also the cost can be reduced.

BRIEF DESCRIPTION OF THE DRAWINGS

The invention will become more fully understood from the detailed description and accompanying drawings, which are given for illustration only, and thus are not limitative of the present invention, and wherein.

DETAILED DESCRIPTION OF THE INVENTION

The present invention will be apparent from the following detailed description, which proceeds with reference to the accompanying drawings, wherein the same references relate to the same elements.

Figure 2:
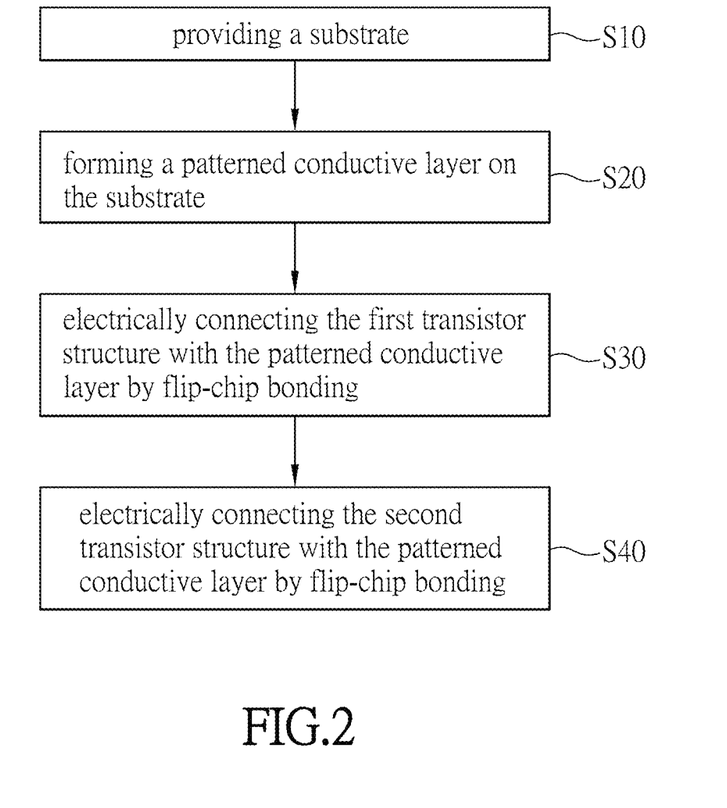
FIG. 2 is a flowchart of a manufacturing method of a semiconductor device of an embodiment of the invention.

FIG. 2 is a flowchart of a manufacturing method of a semiconductor device of an embodiment of the invention, at least including the steps S10 to S40. The manufacturing method of a semiconductor device in this embodiment is used to manufacture a semiconductor device, which can be a cascode transistor shown in FIG. 1 for example. The cascode transistor 1 includes a GaN HEMT 11 and a field effect transistor 12. In this embodiment, the field effect transistor 12 can be a silicon MOSFET. In other embodiments, the field effect transistor 12 can be a non-silicon MOSFET or other kinds of field effect transistors. Moreover, in this embodiment, the GaN HEMT 11 and the field effect transistor 12 are both P-type for example.

Figure 3A:
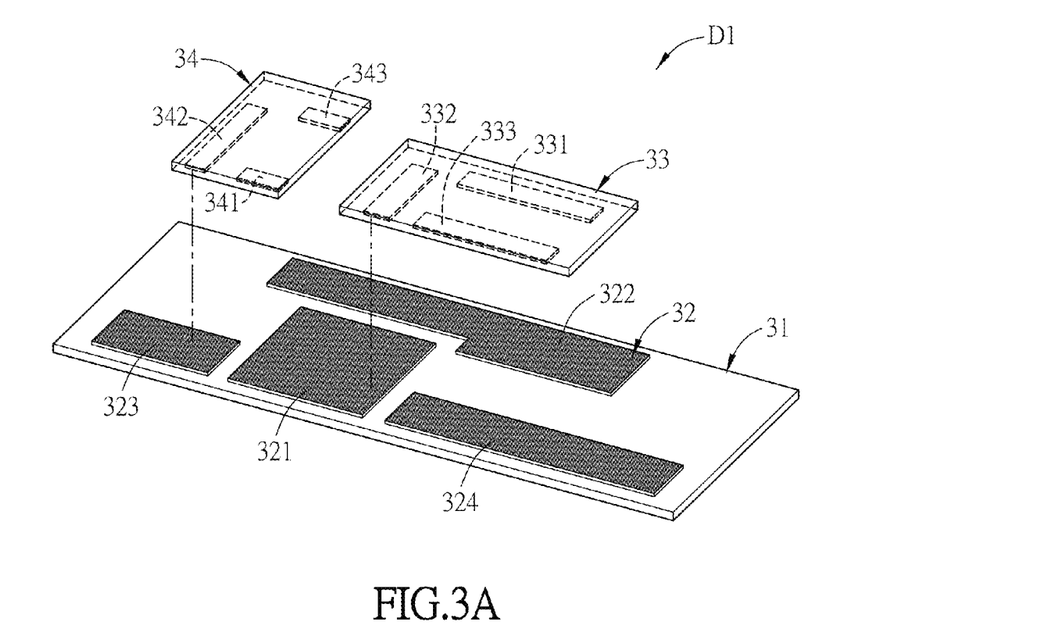
FIG. 3A is a schematic exploded diagram of a semiconductor device of an embodiment of the invention.
Figure 3B:
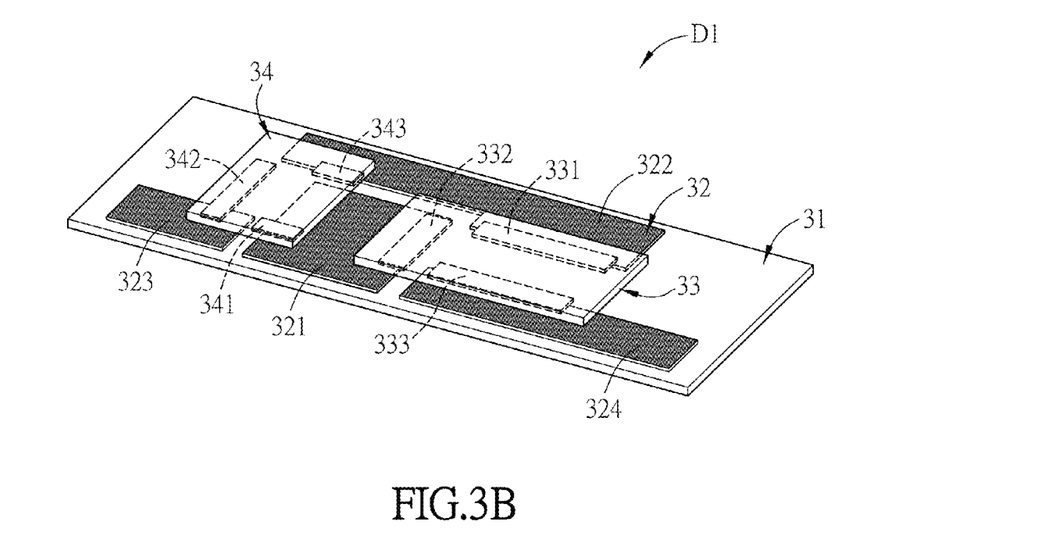
FIG. 3B is a schematic diagram of the semiconductor device in FIG. 3A.
Figure 3C:
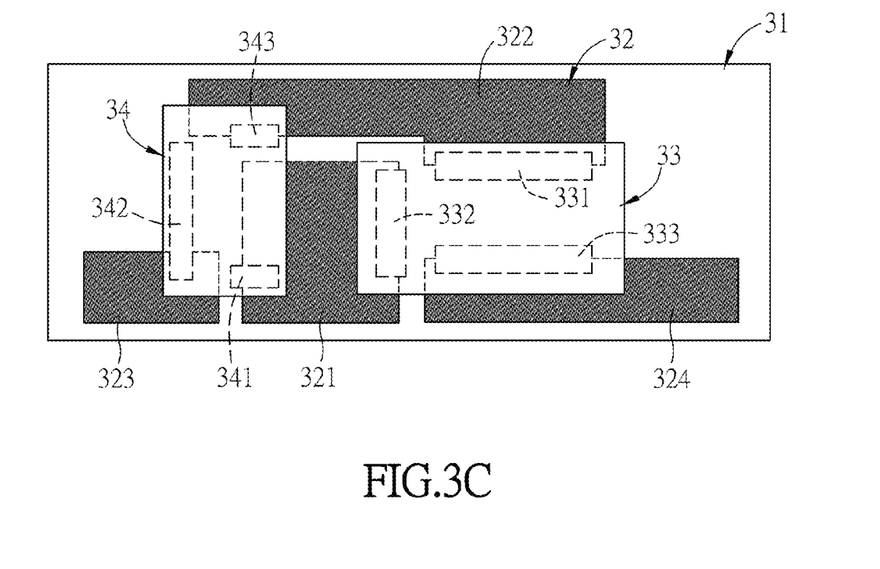
FIG. 3C is a schematic top view of the semiconductor device in FIG. 3B.
Figure 3D:
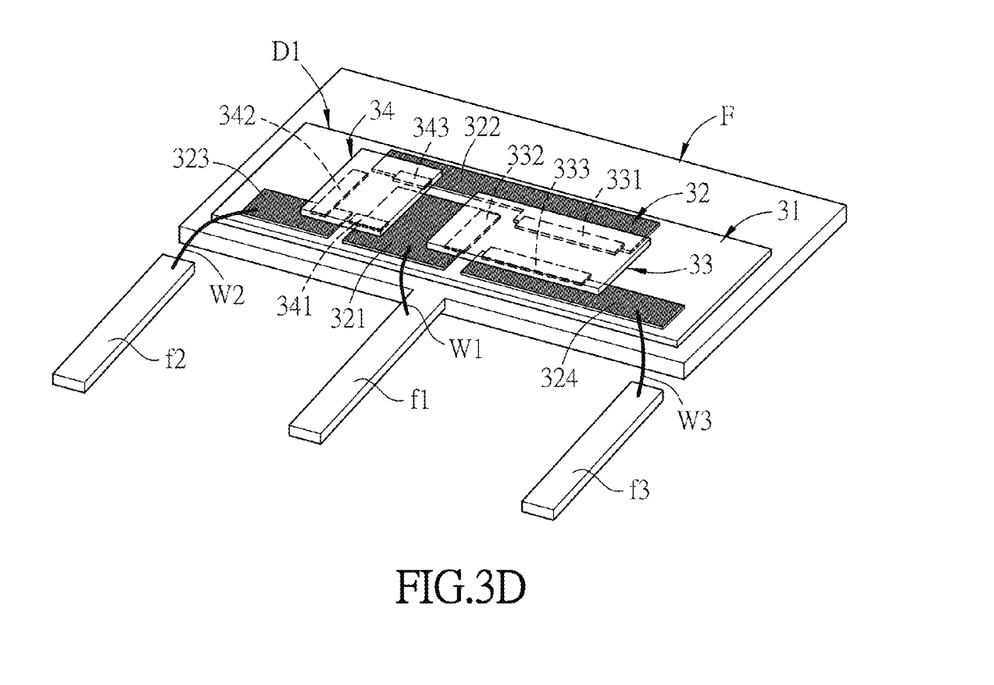
FIG. 3D is a schematic diagram showing the assembly of the semiconductor device in FIG. 3B and a lead frame.

FIG. 3A is a schematic exploded diagram of a semiconductor device D1 of an embodiment of the invention, FIG. 3B is a schematic diagram of the semiconductor device D1 in FIG. 3A, FIG. 3C is a schematic top view of the semiconductor device D1 in FIG. 3B, and FIG. 3D is a schematic diagram showing the assembly of the semiconductor device D1 in FIG. 3B and a lead frame F. The semiconductor device D1 of this embodiment can be the cascode transistor 1 shown in FIG. 1.

As shown in FIGS. 2 to 3C, the step S10 is to provide a substrate 31, which can be a ceramic spacer or another kind of insulating substrate.

Then, the step S20 is to form a patterned conductive layer 32 on the substrate 31. The patterned conductive layer 32 can be made by metal or other kinds of conductive materials. For example, the patterned conductive layer 32 can be made by silver because of its better electrical conductivity. In addition to silver, the patterned conductive layer 32 also can be made by copper because of its lower cost. Of course, the patterned conductive layer 32 can be made by other metals or other kinds of conductive materials.

In practice, the conductive material can be deposited on the substrate 31 to form a conductive layer by chemical vapor deposition (CVD), sputtering, evaporating or other methods. Then, a part of the conductive layer is removed to form the patterned conductive layer 32 on the substrate 31 by photolithography for example. Otherwise, the formation of the patterned conductive layer 32 on the substrate 31 also can be achieved by, for example, cutting a copper sheet into particular shapes and sizes and then attaching the cut copper pieces to the substrate 31 by adhering. In other words, the formation of the patterned conductive layer 32 is not limited in this invention. In an embodiment, the substrate having the patterned conductive layer 32 can be a circuit board having the metal wire.

Then, the step S30 is to electrically connect the first transistor structure 33 with the patterned conductive layer 32 by flip-chip bonding. In this embodiment, the first transistor structure 33 can be a GaN HEMT for example. The first transistor structure 33 includes a first source 331, a first gate 332 and a first drain 333, and the first source 331, the first gate 332 and the first drain 333 are all electrically connected with the patterned conductive layer 32 by flip-chip bonding. Since the flip-chip bonding technology can be comprehended by those skilled in the art, the related illustration is omitted here for conciseness.

Then, the step S40 is to electrically connect the second transistor structure with the patterned conductive layer 32 by flip-chip bonding. In this embodiment, the second transistor structure 34 can be a silicon MOSFET. The second transistor structure 34 includes a second source 341, a second gate 342 and a second drain 343. In this embodiment, the second transistor structure 34 is a silicon MOSFET of a planar structure for example, and that is, the second source 341, the second gate 342 and the second drain 343 are all disposed on the same side of the second transistor structure 34. The second transistor structure 34 is electrically connected with the patterned conductive layer 32 by flip-chip bonding.

Furthermore, the patterned conductive layer 32 of this embodiment can include a plurality of conductive regions, such as a first conductive region 321 and a second conductive region 322. The first gate 332 is electrically connected to the first conductive region 321 by flip-chip bonding. The second source 341 is also electrically connected to the first conductive region 321 by flip-chip bonding. Accordingly, the first gate 332 can be electrically connected with the second source 341 through the first conductive region 321 of the patterned conductive layer 32. The first conductive region 321 can act as the source of the semiconductor device D1.

Besides, the first source 331 is electrically connected to the second conductive region 322 by flip-chip bonding. The second drain 343 is also electrically connected to the second conductive region 322 by flip-chip bonding. Accordingly, the first source 331 can be electrically connected to the second drain 343 through the second conductive region 322 of the patterned conductive layer 32.

In this embodiment, the patterned conductive layer 32 can further include a third conductive region 323. The second gate 342 is electrically connected to the third conductive region 323 by flip-chip bonding. Accordingly, the third conducive region 323 can act as the gate of the semiconductor device D1.

In this embodiment, the patterned conductive layer 32 can further include a fourth conductive region 324. The first drain 333 is electrically connected to the fourth conductive region 324 by flip-chip bonding. Accordingly, the fourth conducive region 324 can act as the drain of the semiconductor device D1.

On the whole, the first transistor structure 33 and the second transistor structure 34 in this embodiment are disposed on the substrate 31 having the patterned conductive layer 32 by flip-chip bonding to form the semiconductor device D1 (the cascode transistor 1 as shown in FIG. 1). In comparison with the conventional art, this embodiment has the advantages as follows. First, the parasitic inductance between the first transistor structure 33 and the second transistor structure 34 that would be caused due to the wire bonding can be avoided, and therefore the device characteristic can be enhanced. Second, the arrangement and design of the patterned conductive layer 32 can match the electrode disposition of the first transistor structure 33 and second transistor structure 34, so as to lower down the manufacturing cost and increase the yield. Third, the overlap between the first drain 333 and other electrodes will uneasily occur in the disposition of this embodiment, and therefore the thickness of the passivation layer of the first transistor structure 33 needn't be increased so that the manufacturing cost can be reduced.

In practice, it can be further implemented to assemble the semiconductor device D1 and the lead frame F. The lead frame F includes a first lead f1, a second lead f2 and a third lead f3, as shown in FIG. 3D.

Further, the semiconductor device D1 can include connection wires W1, W2, W3. The material of the connection wires W1, W2, W3 can include gold, silver, copper, aluminum or other conductive materials. One end of the connection wire W1 is electrically connected to the first conductive region 321 and the other end thereof is electrically connected to the first lead f1, so that the first lead f1 can act as the source of the semiconductor device D1. One end of the connection wire W2 is electrically connected to the third conductive region 323 and the other end thereof is electrically connected to the second lead f2, so that the second lead f2 can act as the gate of the semiconductor device D1. One end of the connection wire W3 is electrically connected to the fourth conductive region 324 and the other end thereof is electrically connected to the third lead f3, so that the third lead f3 can act as the drain of the semiconductor device D1.

In comparison with the conventional art, this embodiment further has the following advantages. First, the patterned conductive layer 32 can be designed according to various kinds of the lead frame F, so as not to be limited to a particular lead frame F. Second, the patterned conductive layer 32 can be designed according to various kinds of the lead frame F and the leads so that the lengths of the connection wires W1, W2, W3 can be lessened and the inductance can be thus reduced. Third, the locations of the connection wires W1, W2, W3 can be adjusted according to the instrument.

Figure 4A:
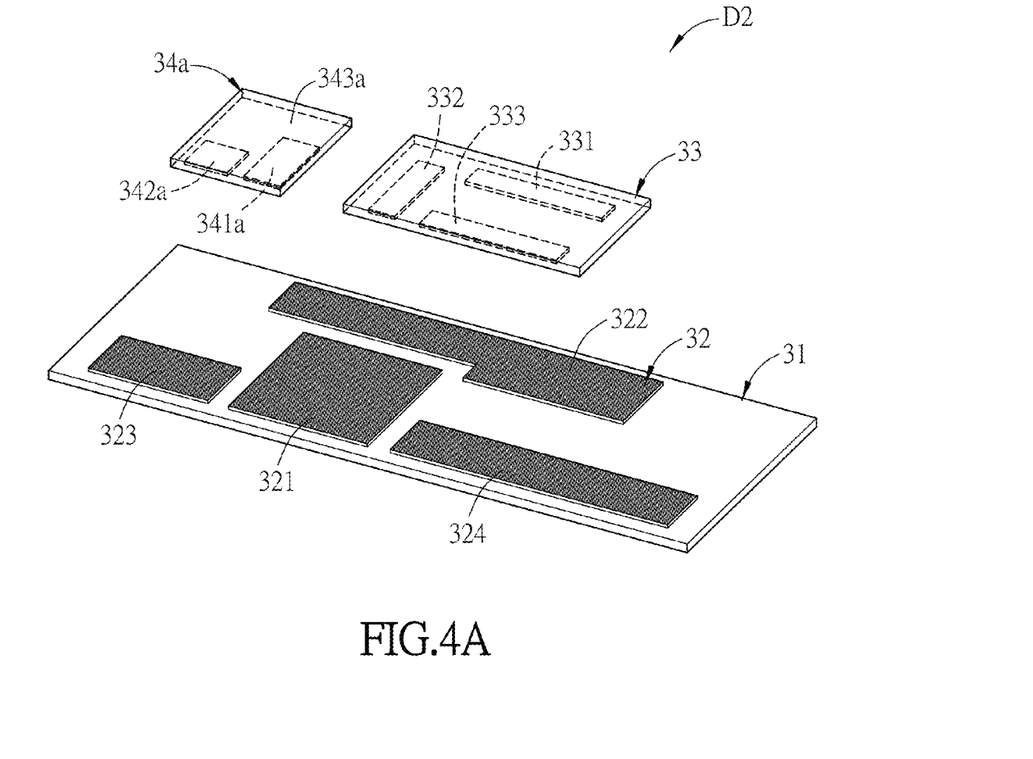
FIG. 4A is a schematic exploded diagram of a semiconductor device of another embodiment of the invention.
Figure 4B:
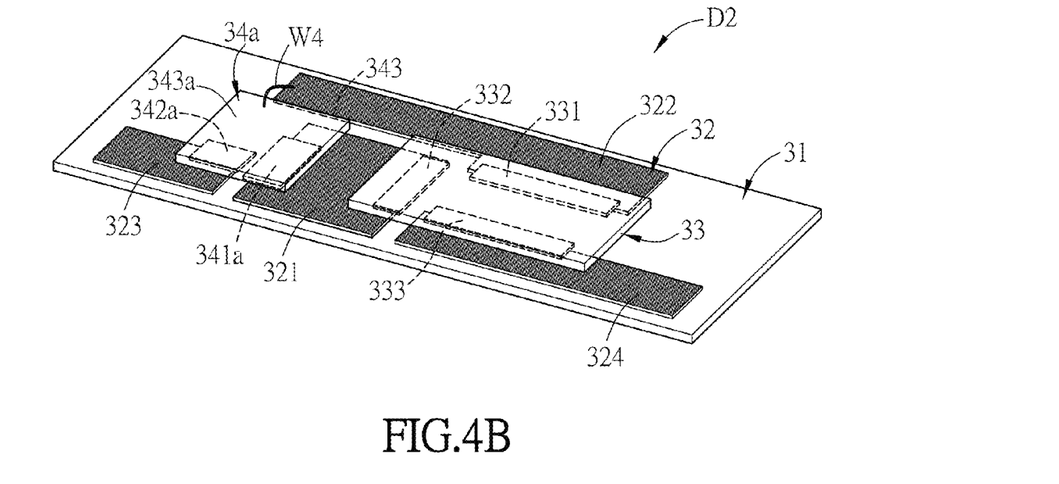
FIG. 4B is a schematic diagram of the semiconductor device in FIG. 4A.
Figure 4C:
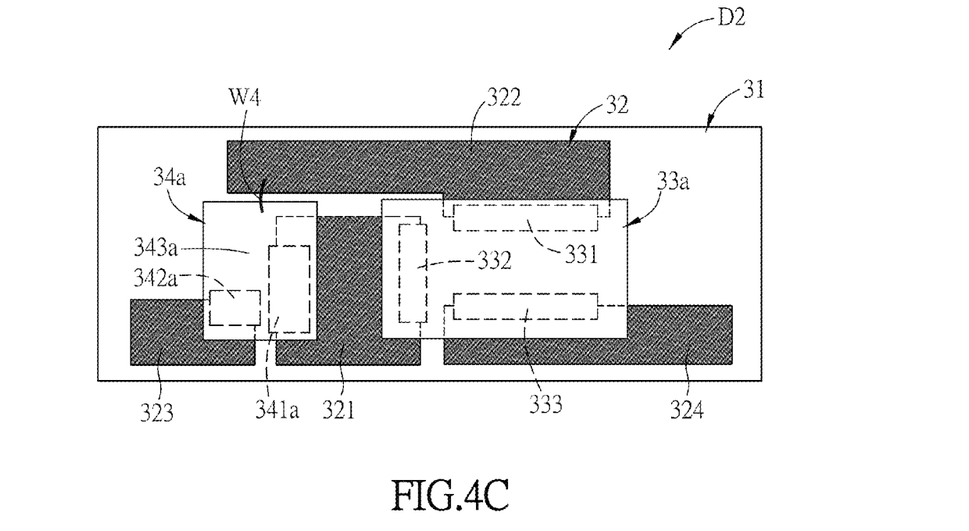
FIG. 4C is a schematic top view of the semiconductor device in FIG. 4B.
Figure 4D:
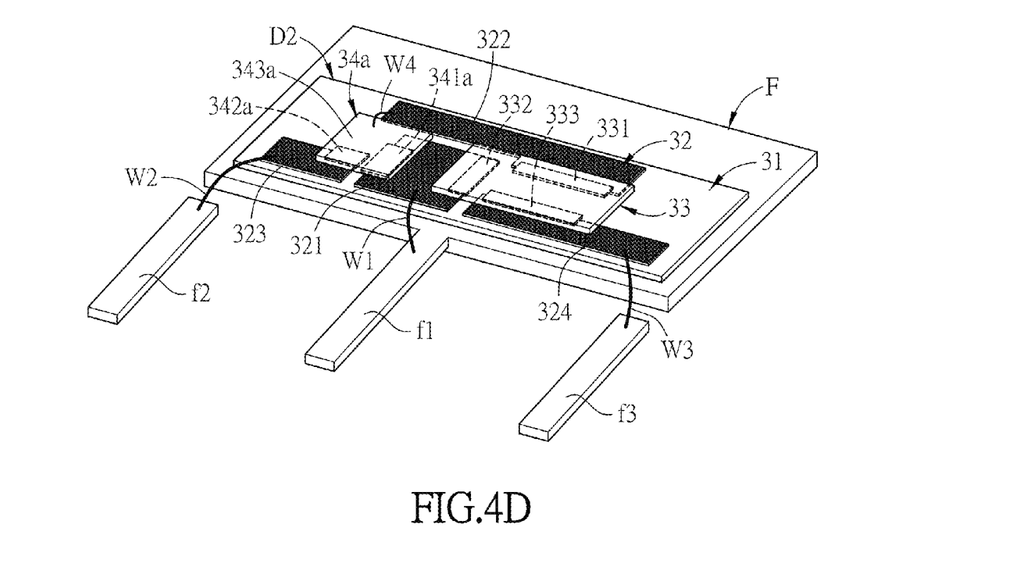
FIG. 4D is a schematic diagram showing the assembly of the semiconductor device in FIG. 4B and a lead frame.

FIG. 4A is a schematic exploded diagram of a semiconductor device D2 of another embodiment of the invention, FIG. 4B is a schematic diagram of the semiconductor device D2 in FIG. 4A, FIG. 4C is a schematic top view of the semiconductor device D2 in FIG. 4B, and FIG. 4D is a schematic diagram showing the assembly of the semiconductor device D2 in FIG. 4B and a lead frame F. The semiconductor device D2 of this embodiment can be the cascode transistor 1 shown in FIG. 1.

The following illustration is given mainly for the difference between the semiconductor devices D2 (FIG. 4A) and D1 (FIG. 3A), and the same part thereof can be comprehended by referring to the above embodiment and is therefore not described here for conciseness.

The second transistor structure 34 in FIG. 3A is a planar structure while the second transistor structure 34a in FIG. 4A is a vertical planar structure. In detail, the second transistor structure 34a includes a second source 341a, a second gate 342a and a second drain 343a. The second source 341a and the second gate 342a are disposed on one side of the second transistor structure 34a, and the second drain 343a is disposed on the other side of the second transistor structure 34a.

Since the second transistor structure 34a is a vertical structure, the semiconductor device D2 requires an additional connection wire W4. The material of the connection wire W4 can include gold, silver, copper, aluminum or other conductive materials. The connection wire W4 can make the second drain 343a electrically connected to the second conductive region 322. Physically, one end of the connection wire W4 is electrically connected to the second drain 343a, and the other end thereof is electrically connected to the second conductive region 322.

Since the second transistor structure 34a is a vertical structure, it has a lower cost and a smaller thermal resistance. Therefore, in comparison with the conventional art and the above embodiment, the semiconductor device D2 of this embodiment can have the advantages of a further reduced cost and a smaller thermal resistance.

Summarily, in the semiconductor device and the manufacturing method thereof of the invention, the first transistor structure and the second transistor structure are disposed on the substrate having the patterned conductive layer by flip-chip bonding to form the cascode transistor device. Therefore, the additional parasitic inductance between the first and second transistor structures that would be caused due to overmuch connection wire can be avoided, and also the cost can be reduced.

Although the invention has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the invention.

What is claimed is:

1. A semiconductor device, comprising:
   a substrate;
   a patterned conductive layer formed on the substrate and including a first conductive region;
   a first transistor structure including a first source, a first gate and a first drain and electrically connected to the patterned conductive layer by flip-chip bonding;
   a second transistor structure including a second source, a second gate and a second drain and electrically connected to the patterned conductive layer by flip-chip bonding; and
   a connection wire,
   wherein the first gate is electrically connected to the second source through the patterned conductive layer, and the first source is electrically connected to the second drain through the patterned conductive layer, the first source and the second drain are both electrically connected to the first conductive region, and one end of said connection wire is directly physically contacting and electrically connected to the second drain and another end of said connection wire is directly physically contacting and electrically connected to the first conductive region.

2. The semiconductor device as recited in claim 1, wherein the patterned conductive layer further includes a second conductive region, and the first gate and the second source are both electrically connected to the second conductive region.

3. The semiconductor device as recited in claim 1, wherein the patterned conductive layer further includes a third conductive region and the second gate is electrically connected to the third conductive region.

4. The semiconductor device as recited in claim 1, wherein the patterned conductive layer further includes a fourth conductive region and the first drain is electrically connected to the fourth conductive region.

5. The semiconductor device as recited in claim 1, wherein the first transistor structure is a GaN high electron mobility transistor and the second transistor structure is a Si metal oxide semiconductor field effect transistor.

6. A manufacturing method of a semiconductor device, at least comprising the steps of:
   providing a substrate;
   forming a patterned conductive layer on the substrate, wherein the patterned conductive layer includes a first conductive region;
   electrically connecting a first transistor structure to the patterned conductive layer by flip-chip bonding, wherein the first transistor structure includes a first source, a first gate and a first drain;
   electrically connecting a second transistor structure to the patterned conductive layer by flip-chip bonding, wherein the second transistor structure includes a second source, a second gate and a second drain, and the first gate is electrically connected to the second source through the patterned conductive layer, and the first source is electrically connected to the second drain through the patterned conductive layer, and the first source and the second drain are both electrically connected to the first conductive region, and
   disposing a connection wire, wherein one end of said connection wire is directly physically contacting and electrically connected to the second drain, and another end of said connection wire is directly physically contacting and electrically connected to the first conductive region.

7. The manufacturing method as recited in claim 6, wherein the first transistor structure is a GaN high electron mobility transistor and the second transistor structure is a Si metal oxide semiconductor field effect transistor.

* * * * *